US012689346B2

(12) United States Patent
Mikawa et al.

(10) Patent No.: US 12,689,346 B2
(45) Date of Patent: Jul. 21, 2026

(54) FILTER DEVICE, HIGH-FREQUENCY MODULE, AND COMMUNICATION DEVICE

(71) Applicant: Murata Manufacturing Co., Ltd., Nagaokakyo (JP)

(72) Inventors: Kentaro Mikawa, Nagaokakyo (JP); Satoshi Shigematsu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 102 days.

(21) Appl. No.: 18/746,111

(22) Filed: Jun. 18, 2024

(65) Prior Publication Data

US 2024/0339982 A1     Oct. 10, 2024

Related U.S. Application Data

(63) Continuation of application No. PCT/JP2023/003160, filed on Feb. 1, 2023.

(30) Foreign Application Priority Data

Feb. 9, 2022     (JP) ................................. 2022-018656

(51) Int. Cl.
H03H 7/01          (2006.01)
H03H 1/00          (2006.01)
(Continued)

(52) U.S. Cl.
CPC ............ H03H 7/0115 (2013.01); H03H 1/00 (2013.01); H03H 7/09 (2013.01); H03H 7/42 (2013.01); *H03H 2001/0085* (2013.01)

(58) Field of Classification Search
CPC ................... H03H 7/0115; H03H 7/09; H03H 2001/0085; H03H 7/42
(Continued)

(56) References Cited

U.S. PATENT DOCUMENTS 8,866,566 B2 * 10/2014 Kameya ................ H03H 7/427
333/181
10,284,164 B2 * 5/2019 Toujo ................... H03H 7/0153
(Continued)

FOREIGN PATENT DOCUMENTS

CN          1716684 A       1/2006
JP          S5558718 U      4/1980
(Continued)

OTHER PUBLICATIONS

International Search Report in PCT/JP2023/003160, mailed Apr. 25, 2023, 3 pages.
(Continued)

*Primary Examiner* — Rakesh B Patel
(74) *Attorney, Agent, or Firm* — Keating & Bennett, LLP

(57)          ABSTRACT

A filter device includes a first terminal, a first inductor, a second inductor, a second terminal, and a first capacitor connected between a first connection point and a ground. The filter device further includes a second capacitor connected either between a second connection point of the first terminal and the first inductor and the ground, or between a third connection point of the second terminal and the second inductor and the ground. The first inductor and the second inductor are mutually additively connected to each other.

20 Claims, 9 Drawing Sheets

100C

(51) Int. Cl.
H03H 7/09 (2006.01)
H03H 7/42 (2006.01)

(58) Field of Classification Search
USPC ......................................... 333/175, 177, 185
See application file for complete search history.

(56) References Cited

U.S. PATENT DOCUMENTS

2008/0180192 A1\* 7/2008 Sakisaka .............. H03H 7/1766
333/185
2012/0075036 A1 3/2012 Kameya
2016/0118951 A1\* 4/2016 Murata ................ H03H 7/0123
333/202
2018/0102752 A1 4/2018 Kishimoto
2018/0212583 A1 7/2018 Toujo
2019/0341902 A1 11/2019 Yoneda et al.

FOREIGN PATENT DOCUMENTS

| | | |
|---|---|---|
| JP | S6035297 Y2 | 10/1985 |
| JP | H1013180 A | 1/1998 |
| JP | 4242160 B2 | 3/2009 |
| JP | 2010141643 A | 6/2010 |
| JP | 201864266 A | 4/2018 |
| WO | 2011052374 A1 | 5/2011 |
| WO | 2017110179 A1 | 6/2017 |
| WO | 2018025342 A1 | 2/2018 |

OTHER PUBLICATIONS

Written Opinion in PCT/JP2023/003160, mailed Apr. 25, 2023, 6 pages.

\* cited by examiner

100C

FILTER DEVICE, HIGH-FREQUENCY MODULE, AND COMMUNICATION DEVICE

CROSS REFERENCE TO RELATED APPLICATIONS

This application claims the benefit of priority to Japanese Patent Application No. 2022-018656 filed on Feb. 9, 2022 and is a Continuation Applications of PCT Application No. PCT/JP2023/003160 filed on Feb. 1, 2023. The entire contents of each application are hereby incorporated herein by reference.

BACKGROUND OF THE INVENTION

1. Field of the Invention

The present disclosure relates to filter devices, high-frequency modules, and communication devices.

2. Description of the Related Art

As a filter device, a low-pass filter described in Japanese Examined Utility Model Registration Application Publication No. 60-35297 is known. The filter device has two inductors connected in series between an input terminal and an output terminal, and the two inductors are magnetically coupled to each other.

SUMMARY OF THE INVENTION

In the filter device described in Japanese Examined Utility Model Registration Application Publication No. 60-35297, it is necessary to increase the magnetic coupling between the inductors to obtain desired characteristics. However, in the filter device, it is difficult to generate strong magnetic coupling between the inductors while ensuring the inductance value required for the filter circuit design.

Especially when the filter device is used for communication in a high frequency band of several 100 MHz, several GHz or the like, since a magnetic material with a large loss cannot be used and the parasitic inductance (ESL: Equivalent Series Inductance) functions as a leakage inductance, it is difficult to ensure the required coupling coefficient.

Example embodiments of the present invention provide filter devices each capable of being used in a high frequency band, high-frequency modules and communication devices including such filter devices.

A filter device according to an example embodiment of the present disclosure includes a first terminal, a first inductor connected to the first terminal, a second inductor connected in series to the first inductor, a second terminal connected to the second inductor, a first capacitor connected between a first connection point of the first inductor and the second inductor and a ground. The filter device further includes a second capacitor connected at least either between a second connection point of the first terminal and the first inductor and the ground, or between a third connection point of the second terminal and the second inductor and the ground. The first inductor and the second inductor are mutually additively connected to each other.

A high-frequency according module to an example embodiment of the present disclosure includes the filter device described above and an electronic component connected to the filter device. A communication device according to an example embodiment of the present disclosure includes the high-frequency module.

According to the example embodiments of the present disclosure, since the second capacitor, which is connected at least either between the second connection point of the first terminal and the first inductor and the ground, or between the third connection point of the second terminal and the second inductor and the ground, is provided, and the first inductor and the second inductor are mutually additively connected, a coupling coefficient required for use in a high frequency band can be ensured.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Filter devices, high-frequency modules, and communication devices according to example embodiments will be described below.

Example Embodiment 1

Figure 1:
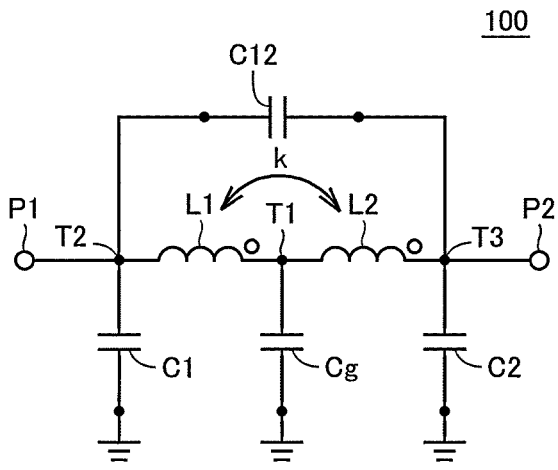
FIG. 1 is a circuit diagram of a filter device according to Example Embodiment 1 of the present invention.

First, a filter device according to Example Embodiment 1 will be described with reference to the drawings. FIG. 1 is a circuit diagram of a filter device 100 according to Example Embodiment 1. The filter device 100 is a pass filter used for communication in a high frequency band of, for example, several 100 MHz, several GHz or the like. In particular, the filter device 100 is an LC filter circuit, as shown in FIG. 1.

Specifically, the filter device 100 includes a first terminal P1, a first inductor L1 connected to the first terminal P1, a second inductor L2 connected in series to the first inductor L1, a second terminal P2 connected to the second inductor L2, and a capacitor Cg (first capacitor) connected between a first connection point T1 of the first inductor L1 and the second inductor L2 and the ground. Further, the filter device 100 includes a capacitor C12 (third capacitor) connected in parallel to the first inductor L1 and the second inductor L2 between the first terminal P1 and the second terminal P2. The first inductor L1 and the second inductor L2 are mutually additively connected. Due to the additive connection, a negative inductor (−M) is left in the circuit configuration.

Further, the filter device 100 includes a capacitor C1 (second capacitor) connected between a second connection point T2 of the first terminal P1 and the first inductor L1 and the ground, and a capacitor C2 (second capacitor) connected between a third connection point T3 of the second terminal P2 and the second inductor L2 and the ground. The capacitors C1 and C2 are shunt capacitors. In the filter device 100, both the capacitor C1 and the capacitor C2 are provided as shunt capacitors; however, it is also possible to either provide the capacitor C1 or the capacitor C2 as a shunt capacitor.

In the filter device 100, by providing the shunt capacitor, the order (number of stages) of the filter is increased. It is known that in a general filter device that does not use a negative inductor, the constant of each element of the filter device becomes smaller as the order (number of stages) increases. Although it is not known in the case of a filter device that uses a negative inductor, it has been discovered that by providing a shunt capacitor, the negative inductor (−M) generated by the magnetic coupling of the first inductor L1 and the second inductor L2 necessary to obtain the desired characteristics, the sum of the first inductor L1 and the lossless inductor (+M), and the sum of the second inductor L2 and the lossless inductor (+M) become smaller.

Figure 2:
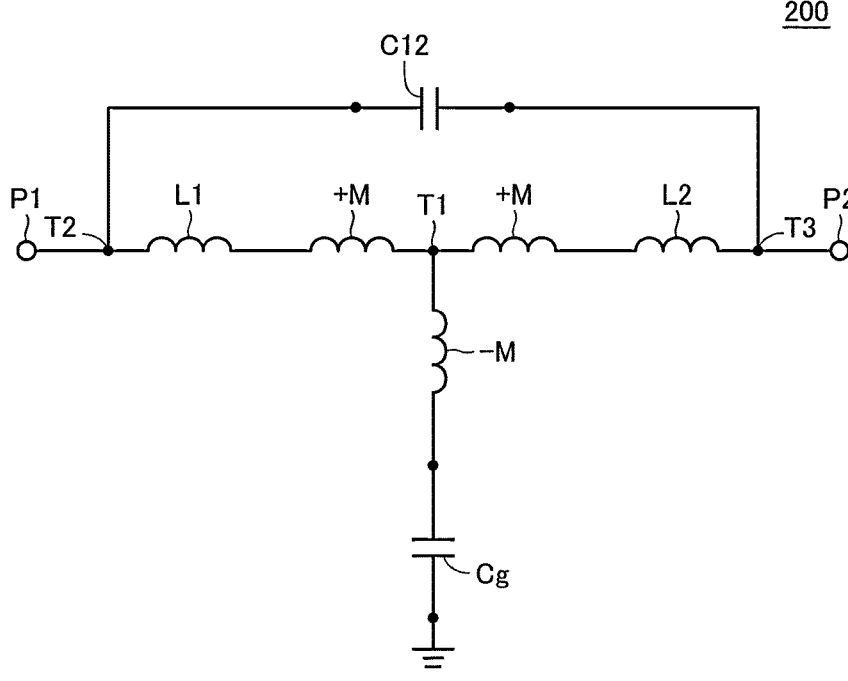
FIG. 2 is an equivalent circuit diagram of a filter device as a comparison.

Here, a filter device as a comparison without providing the capacitors C1 and C2, which are the shunt capacitors, will be described. FIG. 2 is an equivalent circuit diagram of a filter device 200, which is a comparison. In the filter device 200, as in the filter device 100, a first inductor L1 and a second inductor L2 are connected in series between a first terminal P1 and a second terminal P2. Note that, since the circuit shown in FIG. 2 is an equivalent circuit diagram of the filter device 200, a negative inductor (−M) and a lossless inductor (+M) generated by magnetic coupling of the first inductor L1 and the second inductor L2 are also indicated in the drawing.

Similar to the filter device 200, the filter device 100 can cancel the parasitic inductance of the capacitor Cg and can reduce the constant of each element of the filter device 100 by providing the capacitors C1 and C2, which are the shunt capacitors. Therefore, in the filter device 100, by reducing the inductance of the first inductor L1 and the second inductor L2, the parasitic resistance (ESR: Equivalent Series Resistance) itself can be reduced and the insertion loss can be improved.

Further, in the filter device 100, the parasitic resistance can be reduced and the insertion loss can be improved by the lossless inductor (+M) generated by the magnetic coupling

Figure 3:
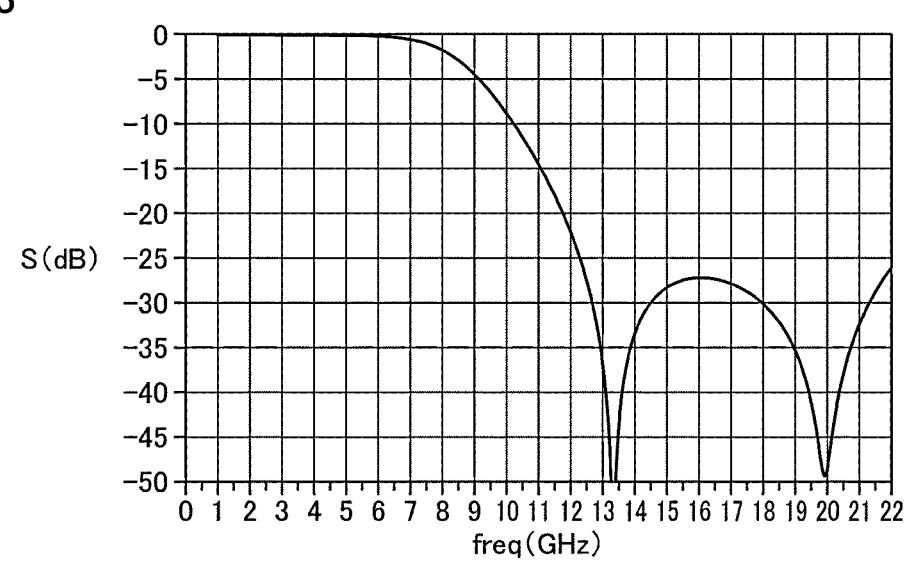
FIG. 3 is a graph showing the transmission characteristics of the filter device according to Example Embodiment 1 of the present invention.

4 of the first inductor L1 and the second inductor L2. FIG. 3 is a graph showing the transmission characteristics of the filter device 100 according to Example Embodiment 1. In FIG. 3, the horizontal axis represents the frequency, and the vertical axis represents the insertion loss.

Here, in order to obtain the characteristics equivalent to the transmission characteristics shown in FIG. 3 in the filter device 200, which is a comparison of the filter device 100, it is necessary to reduce the values of the first inductor L1 and the second inductor L2 of the filter device 200 and to increase the value of the coupling coefficient k. Specifically, in the filter device 200, it is necessary to set the first inductor L1 and the second inductor L2 to about 0.31 nH, the capacitor Cg to about 0.54 pF, the capacitor C12 to about 0.31 pF, and the coupling coefficient k to about 0.65, for example. However, in the practical manufacture of the filter device 200, since the values of the first inductor L1 and the second inductor L2 are small, it is difficult to obtain the required coupling coefficient k.

On the other hand, in the filter device 100 according to the present example embodiment, by providing the capacitors C1 and C2, which are shunt capacitors, it is possible to obtain the transmission characteristics shown in FIG. 3 with the values of the first inductor L1 and the second inductor L2 and the value of the coupling coefficient k set so as to be practically manufacturable. Specifically, in the filter device 100, the first inductor L1 and the second inductor L2 are about 0.38 nH, the capacitor Cg is about 0.30 pF, the capacitor C12 is about 0.24 pF, and the coupling coefficient k is about 0.35, for example. Since the capacitors C1 and C2 newly provided in the filter device 100 are as small as about 0.16 pF, the transmission characteristics shown in FIG. 3 can be obtained while the filter device 100 itself remains miniaturized.

As described later, the filter device 100 is structured as one chip component by stacking a plurality of insulating layers on which electrodes such as coil patterns and the like are formed by the photolithography method.

As described above, in the filter device 100, the constant of each element can be reduced by providing the capacitors C1 and C2, which are shunt capacitors. Therefore, since the negative inductor (−M) and the lossless inductor (+M) required in the filter device 100 can also be reduced, the coupling coefficient k itself between the first inductor L1 and the second inductor L2 can also be reduced. Thus, by providing the capacitors C1 and C2, which are shunt capacitors, the filter device 100 can ensure the required coupling coefficient k while ensuring the required inductance value in the high frequency band.

Figure 4:
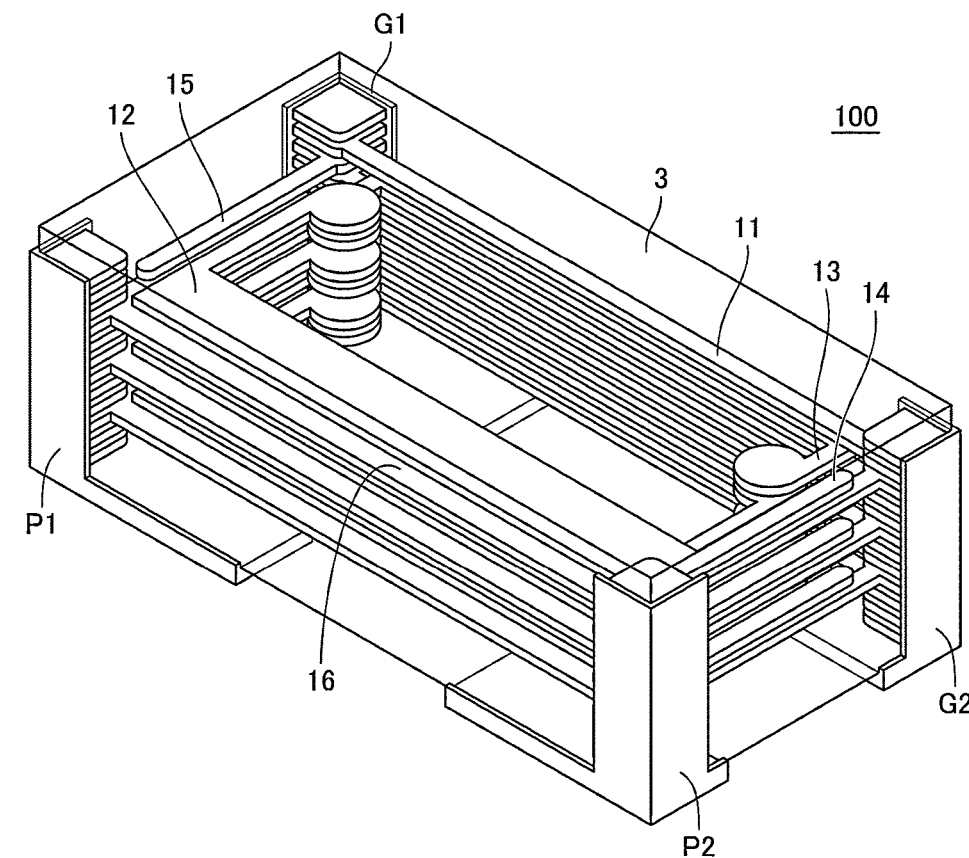
FIG. 4 is a perspective view of the filter device according to Example Embodiment 1 of the present invention.
Figure 5:
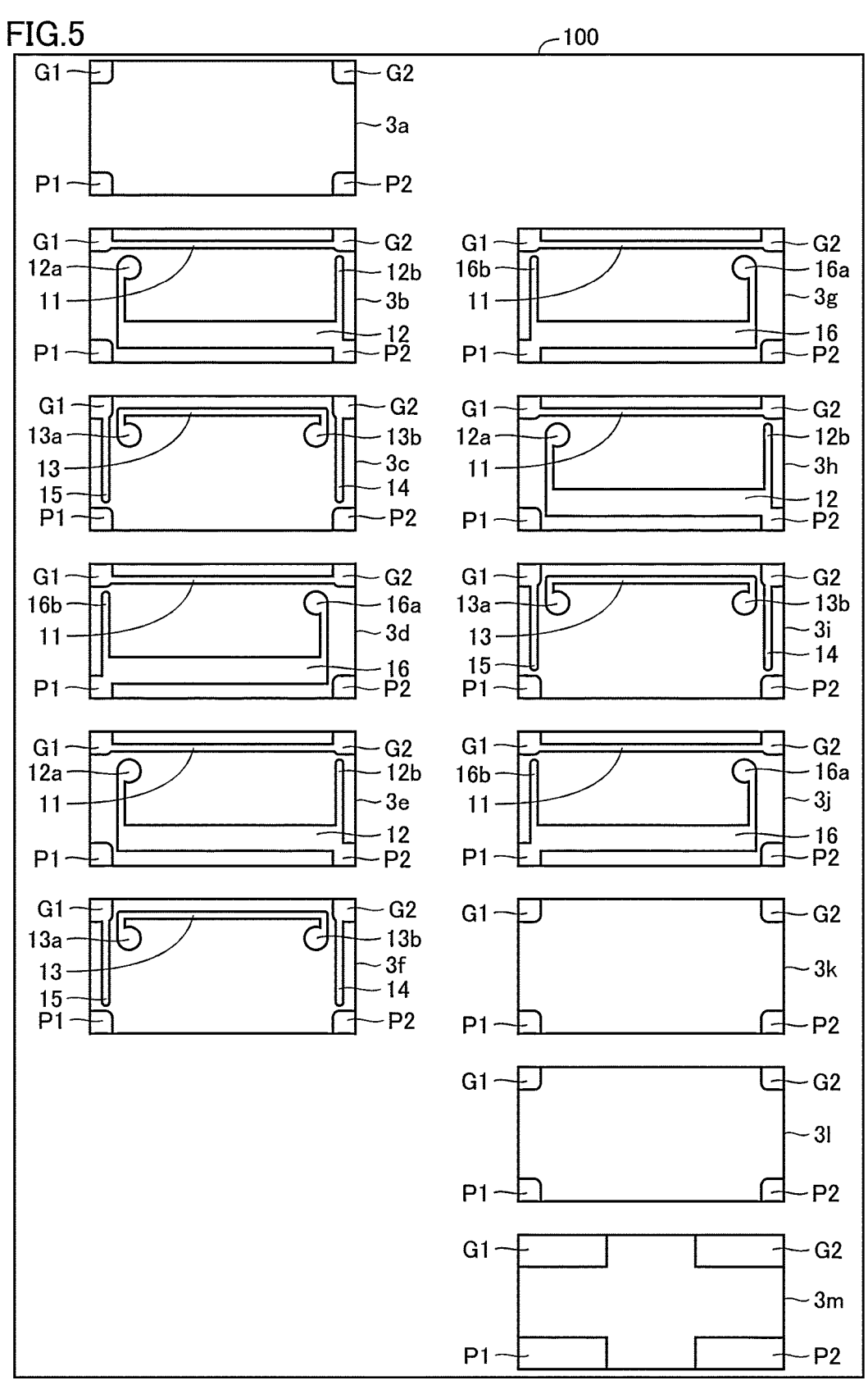
FIG. 5 is an exploded plan view showing a configuration of the filter device according to Example Embodiment 1 of the present invention.

Next, the structure of the filter device 100 will be described. FIG. 4 is a perspective view of the filter device 100 according to Example Embodiment 1. FIG. 5 is an exploded plan view showing a configuration of the filter device 100 according to Example Embodiment 1. As shown in FIGS. 4 and 5, the filter device 100 includes an insulator 3 obtained by stacking a plurality of insulating layers on which wiring patterns of the inductors and the capacitors are formed. The insulating layer is formed of, for example, an insulating material m including borosilicate glass, a dielectric ceramic material such as a low-temperature fired ceramic, an insulating resin such as a glass epoxy resin or a polyimide resin. The interface between the plurality of insulating layers in the insulator 3 may be unclear due to processing such as firing and solidification.

The insulator 3 includes a pair of main surfaces facing each other and side surfaces connecting the main surfaces. Wiring patterns of the first inductor L1, the second inductor L2 and the capacitors C1, C2 and Cg are provided on the main surfaces of the plurality of insulating layers of the insulator 3. Of the pair of main surfaces of the insulator 3, the main surface on the side to be mounted on the substrate is a bottom surface, and the main surface on the opposite side is a top surface. When viewed from the side of one of the main surfaces (the top surface), an electrode of the first terminal P1, an electrode of the second terminal P2, and electrodes of ground terminals G1 and G2 are formed at the four corners of the insulator 3. Each electrode is provided on three surfaces of the insulator 3: a side surface on the long side, a side surface on the short side, and the bottom surface.

In the filter device 100, wiring patterns 16 (first wiring patterns) of a portion of the first inductor L1 and wiring patterns 12 (second wiring patterns) of a portion of the second inductor L2 are arranged within the insulator 3. Further, in the filter device 100, wiring patterns 11 and 13 (in which the wiring patterns 11 are grounded) of a portion of the capacitor Cg, wiring patterns 15 and wiring patterns arranged in insulating layers 3d, 3g and 3j of a portion of the capacitor C1 (in which the wiring patterns 15 are grounded), and wiring patterns 14 and wiring patterns arranged in insulating layers 3b, 3e and 3h of a portion of the capacitor C2 (in which the wiring patterns 14 are grounded) are arranged within the insulator 3. Note that the capacitor C12 includes an overlapping portion between the wiring patterns 16 and the wiring patterns 12. The wiring patterns 16 and the wiring patterns 12 are strongly magnetically coupled to each other in the overlapping portion.

The wiring patterns 16 and the wiring patterns 12 are stacked in the direction between the main surfaces (i.e., the vertical direction in FIG. 4) in the insulator 3. Further, the wiring patterns 16 and the wiring patterns 12 are alternately stacked in the insulator 3, and the first inductor L1 and the second inductor L2 are mutually additively connected. By stacking the wiring patterns 16 and the wiring patterns 12 in such a manner, the required coupling coefficient k between the first inductor L1 and the second inductor L2 is ensured.

Note that the state in which the inductors are additively connected is a state in which, when a current flows from one inductor to the other inductor via a connection point, the magnetic fields generated by the two inductors have the same directions so as to intensify each other, i.e., is a state in which the magnetic fluxes crossing the wiring pattern of the inductor are shared. For example, when the two inductors have a coil shape and the openings of the coils overlap each other when viewed in plan, the winding direction from the end of one coil to the connection point of the two coils is the same as the winding direction from the connection point of the two coils to the end of the other coil.

The configuration of each layer of the filter device 100 will be described below with reference to the exploded plan view shown in FIG. 5. The electrode of the first terminal P1, the electrode of the second terminal P2, the electrodes of the ground terminals G1 and G2, and the wiring patterns 11 to 16 are each provided on insulating layers 3a to 3m by the photolithography method. On the insulating layer 3a shown in FIG. 5, an electrode of the first terminal P1, an electrode of the second terminal P2, and electrodes of the ground terminals G1 and G2 are located at four corners.

The electrodes of the first terminal P1 on each layer are electrically connected by the electrodes on the side surface of the long side and the side surface of the short side shown in FIG. 4. The electrodes of the second terminal P2 and the electrodes of the ground terminals G1 and G2 on each layer are also electrically connected by the electrodes on the side surface of the long side and the side surface of the short side, respectively. Instead of being electrically connected by the electrodes on the side surface of the long side and the side surface of the short side, each layer may be connected through via conductors to thereby electrically connect the electrodes of the first terminal P1, the electrodes of the second terminal P2, and the electrodes of the ground terminals G1 and G2, respectively, provided on each layer. In the filter device 100, as shown in FIG. 4, the first terminal P1 and the second terminal P2 are arranged along one long side of the insulator 3, and the ground terminals G1 and G2 are arranged along the other long side of the insulator 3. However, the arrangement of the terminals is not limited to the above-described manner, and in the filter device 100, the first terminal P1 and the second terminal P2 may be arranged along one short side of the insulator 3, and the ground terminals G1 and G2 may be arranged along the other short side of the insulator 3.

A wiring pattern 11 and a wiring pattern 12 are provided on the insulating layer 3b. The wiring pattern 11 is electrically connected to the electrodes of the ground terminals G1 and G2, and defines an electrode on the ground side of the capacitor Cg. In the wiring pattern 12, a portion extending from the electrode of the second terminal P2 to a connection portion 12a along the long and short sides of the insulating layer 3b defines a part of the second inductor L2. Further, in the wiring pattern 12, a portion 12b extending from the electrode of the second terminal P2 along the short side defines an electrode on the third connection point T3 side of the capacitor C2.

A wiring pattern 13, a wiring pattern 14 and a wiring pattern 15 are provided on the insulating layer 3c. The wiring pattern 13 is extending from a connection portion 13a to a connection portion 13b along the long side of the insulating layer 3c. The connection portion 13a is electrically connected to the connection portion 12a of the insulating layer 3b through a via conductor, and the connection portion 13b is electrically connected to a connection portion 16a of the insulating layer 3d through a via conductor.

The wiring pattern 13 is also the first connection point T1 connecting the first inductor L1 and the second inductor L2, and defines the capacitor Cg with the wiring patterns 11 arranged in the insulating layer 3b and the like. The wiring pattern 14 extends along the short side from the electrode of the ground terminal G2, and defines an electrode on the ground side of the capacitor C2. The wiring pattern 15 extends along the short side from the electrode of the ground terminal G1, and defines an electrode on the ground side of the capacitor C1.

A wiring pattern 11 and a wiring pattern 16 are provided on the insulating layer 3d. The wiring pattern 11 is electrically connected to the electrodes of the ground terminals G1 and G2, and defines an electrode on the ground side of the capacitor Cg. In the wiring pattern 16, a portion extending from the electrode of the first terminal P1 to the connection portion 16a along the long and short sides of the insulating layer 3d defines a part of the first inductor L1. Further, in the wiring pattern 16, a portion 16b extending from the electrode of the first terminal P1 along the short side defines an electrode on the second connection point T2 side of the capacitor C1.

The subsequent layers repeat the insulating layers 3b to 3d. The same wiring patterns as those of the insulating layer 3b are provided on the insulating layer 3e and the insulating layer 3h. The same wiring patterns as those of the insulating layer 3c are provided on the insulating layer 3f and the insulating layer 3i. The same wiring patterns as those of the insulating layer 3d are provided on the insulating layer 3g and the insulating layer 3j.

Only an electrode of the first terminal P1, an electrode of the second terminal P2, and electrodes of the ground terminals G1 and G2 are provided on the insulating layer 3k and the insulating layer 3l. When the filter device 100 is mounted on a substrate of a high-frequency module or the like, an electrode of the first terminal P1, an electrode of the second terminal P2, and electrodes of the ground terminals G1 and G2 to electrically connect to the wiring of the substrate are provided on the insulating layer 3m at four corners. The electrodes provided on the insulating layer 3m are larger in area than the other insulating layers 3a to 3l to electrically connect to the wiring of the substrate.

The plurality of insulating layers 3a to 3m of the filter device 100 shown in FIG. 5 are stacked and subjected to a process such as firing and solidification. The electrode of the first terminal P1, the electrode of the second terminal P2, and the electrodes of the ground terminals G1 and G2 shown in FIG. 4 are provided on the side surfaces of the insulator 3 which has been subjected to the process such as firing and solidification.

In the filter device 100, each of the wiring pattern 16 and the wiring pattern 12 has a loop shape of less than one turn when viewed from the side of the top surface, and the wiring pattern 16 and the wiring pattern 12 are combined to define a coil pattern of one or more turns in the insulator 3. Therefore, in the filter device 100, the wiring pattern 16 and the wiring pattern 12, which are connected in parallel and each have a loop shape of less than one turn, overlap each other, so that the coupling coefficient k required for use in the high frequency band is ensured while reducing the inductance values of the first inductor L1 and the second inductor L2.

Further, the wiring patterns 16 are provided on the insulating layers 3d, 3g and 3j, and are connected in parallel by electrically connecting each other through via conductors. The wiring patterns 12 are provided on the insulating layers 3b, 3e and 3h, and are connected in parallel by electrically connecting each other through via conductors. With such a configuration, the resistance generated by the first inductor L1 and the second inductor L2 can be reduced, so that an inductor with high Q value can be obtained.

Figure 6:
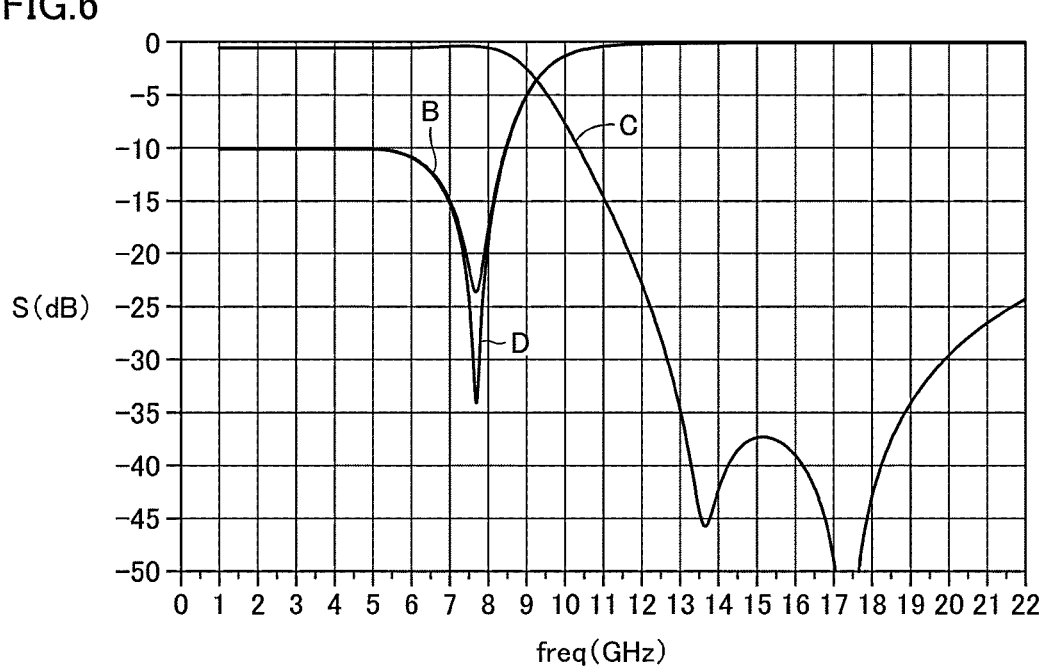
FIG. 6 is a graph showing transmission characteristics with respect to frequency for the filter device according to Example Embodiment 1 of the present invention.

FIG. 6 is a graph showing transmission characteristics with respect to frequency for the filter device 100 according to Example Embodiment 1. In FIG. 6, the horizontal axis represents the frequency, and the vertical axis represents the loss. Here, graph B is a simulation result of the return loss on the input side of the filter device 100. Graph C is a simulation result of the insertion loss of the filter device 100. Graph D is a simulation result of the return loss on the output side of the filter device 100.

It can be known from FIG. 6 that the filter device 100 functions as a low-pass filter (LPF) with two attenuation poles at about 13.5 GHZ and about 17.3 GHZ, for example.

As described above, the filter device 100 according to Example Embodiment 1 includes the first terminal P1, the first inductor L1 connected to the first terminal P1, the second inductor L2 connected in series to the first inductor L1, the second terminal P2 connected to the second inductor L2, and the capacitor Cg connected between the first connection point T1 of the first inductor L1 and second inductor L2 and the ground. Further, the filter device 100 includes the capacitors C1 and/or C2 connected at least either between the second connection point T2 of the first terminal P1 and the first inductor L1 and the ground or between the third connection point T3 of the second terminal P2 and the second inductor L2 and the ground. The first inductor L1 and the second inductor L2 are additively connected to each other.

Thus, the filter device 100 according to Example Embodiment 1 can ensure a coupling coefficient required for use in the high frequency band, and can obtain a compact pass filter possible to be used in the high frequency band.

Further, it is preferable to further provide the capacitor C12 connected in parallel to the first inductor L1 and the second inductor L2 between the first terminal P1 and the second terminal P2. Thus, in the filter device 100, the element to determine the resonant frequency can be increased, so that the constant of each element can be reduced, the degree of design freedom can be improved, and the size of the device can be reduced.

The first inductor L1, the second inductor L2, the capacitor Cg, and the capacitors C1 and C2 are in the insulator 3, which includes a pair of main surfaces facing each other and side surfaces connecting the main surfaces. The insulator 3 preferably includes a plurality of wiring patterns 16 that are arranged within the insulator 3 and that define a portion of the first inductor L1, and a plurality of wiring patterns 12 that are arranged to at least partially overlap, when viewed from the side of one of the main surfaces (the top surface), with the wiring pattern 16 and that define a portion of the second inductor L2. Thus, the filter device 100 can achieve an additive connection configuration in which the currents flowing through the first inductor L1 and the second inductor L2 are in the same direction and the magnetic fields generated are also in the same direction.

Preferably, the wiring patterns 16 and the wiring patterns 12 are stacked in the direction between the main surfaces in the insulator 3. Thus, in the filter device 100, the wiring patterns of the first inductor L1 and the second inductor L2 overlap each other, so that the magnetic coupling can be strengthened.

Preferably, the wiring patterns 16 and the wiring patterns 12 are alternately stacked in the insulator 3. Thus, in the filter device 100, since the wiring patterns of the first inductor L1 and the second inductor L2 to be magnetically coupled can be located close to each other in the stacking direction, the magnetic coupling can be strengthened.

The insulator 3 preferably includes an electrode connected to the first terminal P1, an electrode connected to the second terminal P2, and electrodes of the ground terminals G1 and G2. Thus, in the filter device 100, the wiring patterns can be effectively arranged when the insulator 3 is viewed from the top surface side, so that miniaturization can be achieved.

It is preferred that each of the wiring pattern 16 and the wiring pattern 12 has a loop shape of less than one turn when viewed from the side of one of the main surfaces (the top surface), and the wiring pattern 16 and the wiring pattern 12 are combined to define a coil pattern of one or more turns in the insulator 3. Thus, in the filter device 100, the coupling coefficient k required for use in the high frequency band can be ensured while reducing the inductance values of the first inductor L1 and the second inductor L2. By combining the wiring pattern 16 and the wiring pattern 12 to provide a loop shape of one or more turns, it is possible to provide a portion where the magnetic fluxes generated by the first inductor L1 and the second inductor L2 are strengthened while connecting the inductors. Thus, the first inductor L1 and the second inductor L2 can be additively connected.

Example Embodiment 2

Figure 7:
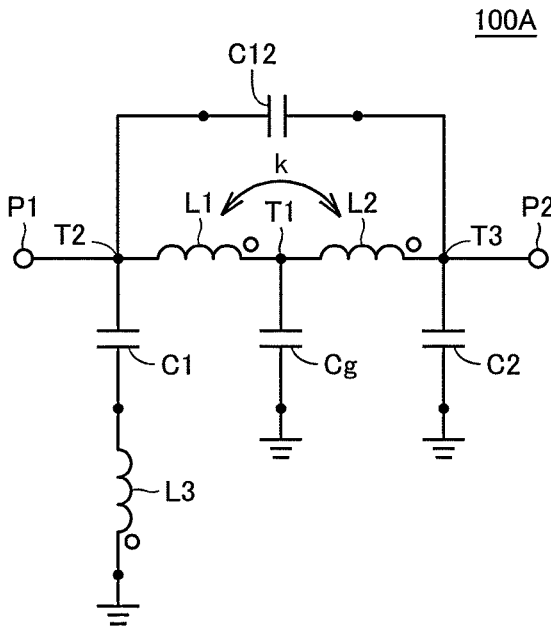
FIG. 7 is a circuit diagram of a filter device according to Example Embodiment 2 of the present invention.

In the filter device 100 according to Example Embodiment 1, the capacitors C1 and C2 are directly connected to the ground as shown in FIG. 1. However, in a filter device 100A according to Example Embodiment 2, a configuration in which capacitors C1 and C2 are connected to the ground via an inductor will be described. FIG. 7 is a circuit diagram of the filter device 100A according to Example Embodiment 2. In the filter device 100A shown in FIG. 7, the same components as those of the filter device 100 shown in FIG. 1 are denoted by the same reference signs, and the detailed description thereof will not be repeated.

The filter device 100A includes a capacitor C1 (second capacitor) connected to a second connection point T2 and a third inductor L3 connected between the capacitor C1 and the ground. Further, the filter device 100A includes a capacitor C2 (second capacitor) connected between a third connection point T3 and the ground. In addition to being provided between the capacitor C1 and the ground, the third inductor L3 may also be provided between the capacitor C2 and the ground. Further, the third inductor L3 may be provided between the capacitor C2 and the ground but not be provided between the capacitor C1 and the ground.

In the filter device 100A, a shunt capacitor is provided in both the capacitor C1 and the capacitor C2, but the shunt capacitor may be provided in one of the capacitors C1 and C2. In such a case, in the filter device 100A, the third inductor L3 is provided between the shunt capacitor (capacitor C1 or capacitor C2) and the ground.

Figure 8:
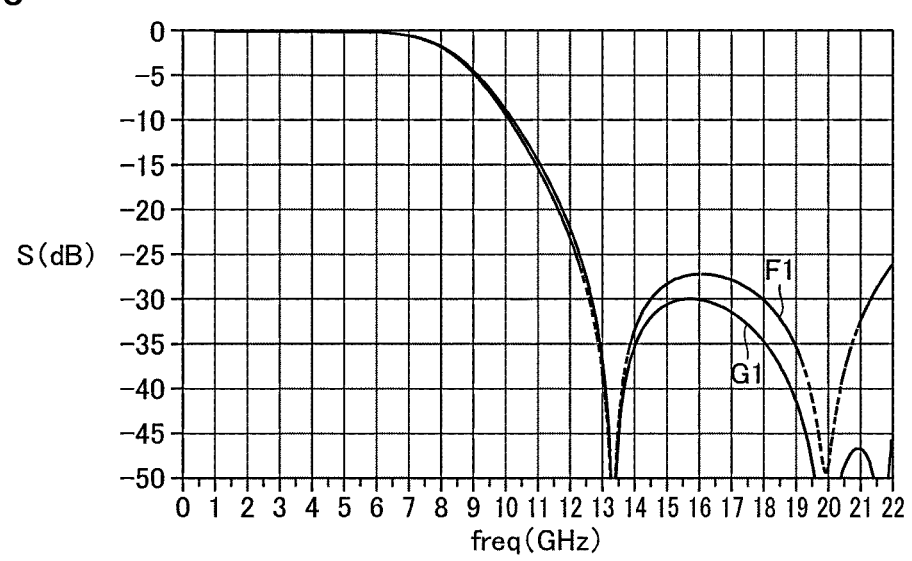
FIG. 8 is a graph showing transmission characteristics with respect to frequency for the filter device according to Example Embodiment 2 of the present invention.

FIG. 8 is a graph showing transmission characteristics with respect to frequency for the filter device according to Example Embodiment 2. In FIG. 8, the graph shows the transmission characteristics when the third inductor L3 is set to about 0.33 nH. The parameters of the other elements are set to be the same as the values of the parameters of respective elements of the filter device 100 indicated by the graph shown in FIG. 3. In FIG. 8, the horizontal axis represents the frequency, the vertical axis represents the insertion loss; and graph G1 is a simulation result of the insertion loss in the filter device 100A (L3=about 0.33 nH). Graph F1 is a simulation result of the insertion loss of a filter device in which the third inductor L3 is not provided.

Figure 9:
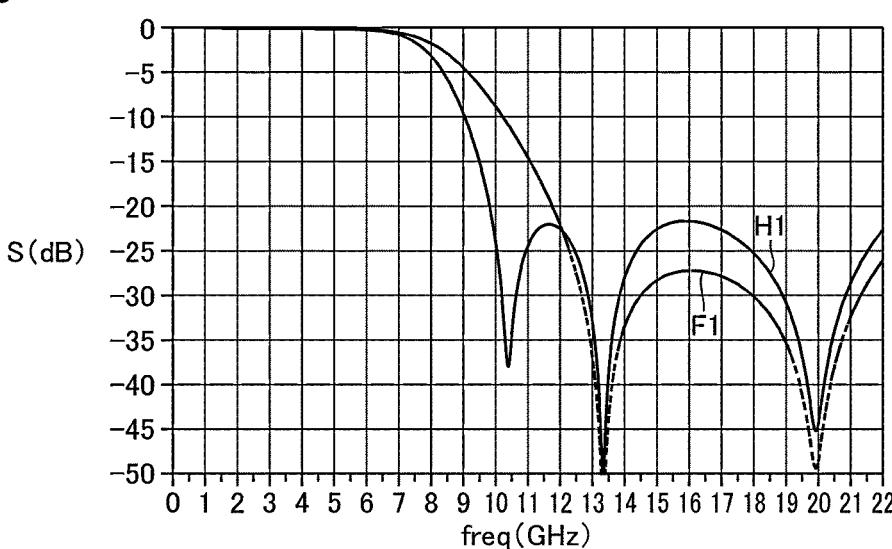
FIG. 9 is a graph showing other transmission characteristics with respect to frequency for the filter device according to Example Embodiment 2 of the present invention.

FIG. 9 showing is a graph other transmission characteristics with respect to the frequency for the filter device according to Example Embodiment 2. In FIG. 9, the graph shows the transmission characteristics when the third inductor L3 is set to about 1.44 nH. The other parameters are the same as those of the simulation indicated by the graph shown in FIG. 6.

In FIG. 9, the horizontal axis represents the frequency, the vertical axis represents the insertion loss; and graph H1 is a simulation result of the insertion loss of the filter device 100A (L3=about 1.44 nH). Graph F1 is a simulation result of the insertion loss of a filter device in which the third inductor L3 is not provided.

As shown in FIGS. 8 and 9, in the filter device 100A, by providing the third inductor L3 connected in series to the shunt capacitor, the number of attenuation poles can be increased to make the attenuation band wider and deeper, and the steepness between the pass band and the attenuation band can be improved.

As described above, the filter device 100A according to Example Embodiment 2 further includes the third inductor L3 connected in series between the shunt capacitor (the capacitors C1 and/or C2) and the ground. Thus, in the filter device 100A, the attenuation poles caused by the resonance between the shunt capacitor (capacitors C1 and/or C2) and the third inductor L3 in the attenuation band can be provided, thereby improving the attenuation characteristics and steepness.

Example Embodiment 3

In the filter device 100 according to Example Embodiment 1, as shown in FIG. 1, a configuration in which the shunt capacitors (capacitors C1 and C2) are provided for one unit including the first inductor L1, the second inductor L2, and the capacitor Cg has been described. In a filter device according to Example Embodiment 3, a configuration in which a plurality of units each including a first inductor L1, a second inductor L2, and a capacitor Cg are connected, and shunt capacitors are provided to the connected units will be described.

Figure 10:
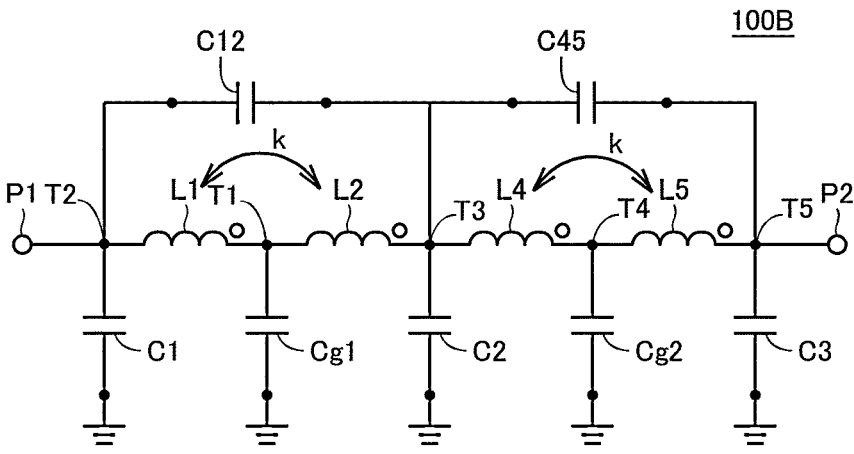
FIG. 10 is a circuit diagram of a filter device according to Example Embodiment 3 of the present invention.

FIG. 10 is a circuit diagram of a filter device 100B according to Example Embodiment 3. In the filter device 100B shown in FIG. 10, the same components as those of the filter device 100 shown in FIG. 1 are denoted by the same reference signs, and the detailed description thereof will not be repeated.

Specifically, the filter device 100B includes a first terminal P1, a first inductor L1 connected to the first terminal P1, a second inductor L2 connected in series to the first inductor L1, a fourth inductor L4 connected in series to the second inductor L2, a fifth inductor L5 connected in series to the fourth inductor L4, and a second terminal P2 connected to the fifth inductor L5. Further, the filter device 100B includes a capacitor Cg1 (first capacitor) connected between a first connection point T1 of the first inductor L1 and the second inductor L2 and the ground, and a capacitor Cg2 (first capacitor) connected between a fourth connection point T4 of the fourth inductor L4 and the fifth inductor L5 and the ground. The first inductor L1 and the second inductor L2 are mutually additively connected, and the fourth inductor L4 and the fifth inductor L5 are mutually additively connected.

The filter device 100B has a configuration in which a unit including the first inductor L1, the second inductor L2, and the capacitor Cg1 and a unit including the fourth inductor L4, the fifth inductor L5, and the capacitor Cg2 are connected. In other words, the filter device 100B has a configuration in which two units of the circuit shown in the filter device 100 are cascade-connected. Further, the filter device 100B includes a capacitor C12 (third capacitor) connected in parallel to the first inductor L1 and the second inductor L2, and a capacitor C45 (third capacitor) connected in parallel to the fourth inductor L4 and the fifth inductor L5.

The filter device 100B includes, as shunt capacitors, a capacitor C1 (second capacitor) connected to a second connection point T2, a capacitor C2 (second capacitor) connected to a third connection point T3, and a capacitor C3 (second capacitor) connected to a fifth connection point T5. Note that the filter device 100B is not limited to the case where shunt capacitors are provided at all of the second connection point T2, the third connection point T3, and the fifth connection point T5, but may include a case where a shunt capacitor is provided at least at one of the second connection point T2, the third connection point T3, and the fifth connection point T5.

Further, in the filter device 100B, the third inductor L3 described in Example Embodiment 2 may be connected in series between the shunt capacitor (capacitors C1, C2 and/or C3) and the ground.

Figure 11:
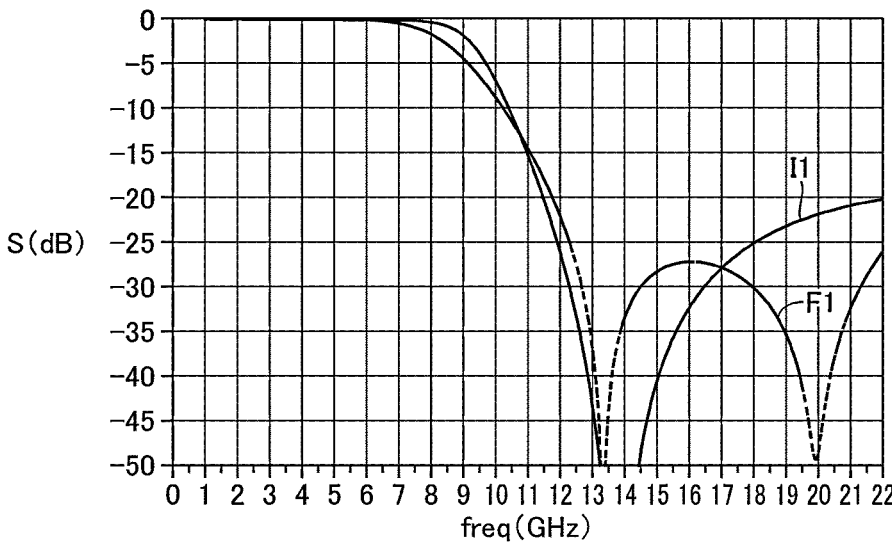
FIG. 11 is a graph showing transmission characteristics with respect to frequency for the filter device according to Example Embodiment 3 of the present invention.

FIG. 11 is a graph showing transmission characteristics with respect to frequency for the filter device according to Example Embodiment 3. As shown in FIG. 11, a simulation of the filter device 100B was performed in which the first inductor L1 and the fourth inductor L4 was about 0.325 nH, the second inductor L2 and the third inductor L3 were about 0.326 nH, the capacitors Cg1 and Cg2 was about 0.071 pF, the capacitors C12 and C45 was about 0.171 pF, the capacitors C1 and C3 was about 0.012 pF, the capacitor C2 was about 0.371 pF, and the coupling coefficient k was about 0.348, for example.

In FIG. 11, the horizontal axis represents the frequency, the vertical axis represents the insertion loss; and graph I1 shows a simulation result of the insertion loss of the filter device 100B. Graph F1 shows a simulation result of the insertion loss of a filter device in which the fourth inductor L4, the fifth inductor L5 and the like are not provided.

As shown in FIG. 10, the filter device 100B can improve the steepness of the attenuation band as shown in FIG. 11 by connecting a plurality of units each including the first inductor L1, the second inductor L2, and the capacitor Cg.

As described above, in the filter device 100B according to Example Embodiment 3, since a plurality of units, each having a configuration including the first inductor L1, the second inductor L2 and the capacitor Cg, are connected, the attenuation characteristics can be improved.

Example Embodiment 4

Figure 12:
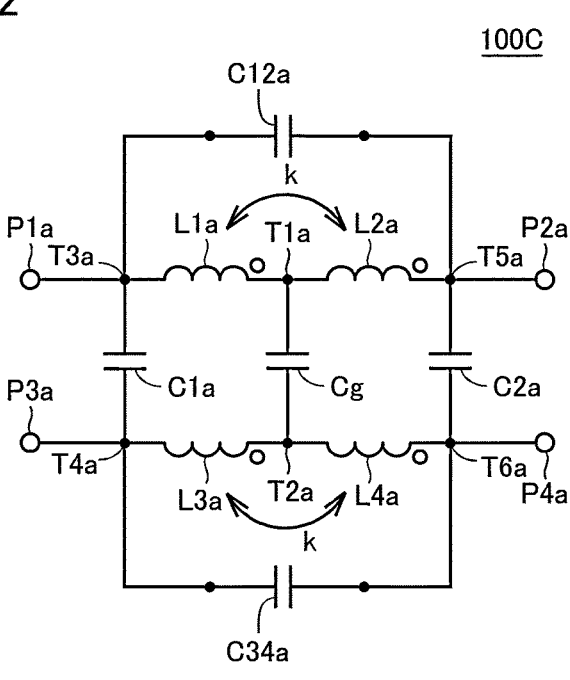
FIG. 12 is a circuit diagram of a filter device according to Example Embodiment 4 of the present invention.

In the filter device 100 according to Example Embodiment 1, as shown in FIG. 1, a filter device including an unbalanced circuit (single wire ground) has been described. In a filter device according to Example Embodiment 4, a filter device having a balanced circuit will be described. FIG. 12 is a circuit diagram of a filter device 100C according to Example Embodiment 4.

Specifically, the filter device 100C includes a first balanced terminal P1a, a first balanced inductor L1a connected to the first balanced terminal P1a, a second balanced inductor L2a connected in series to the first balanced inductor L1a, and a second balanced terminal P2a connected to the second balanced inductor L2a. Further, the filter device 100C includes a third balanced terminal P3a, a third balanced inductor L3a connected to the third balanced terminal P3a, a fourth balanced inductor L4a connected in series to the third balanced inductor L3a, and a fourth balanced terminal P4a connected to the fourth balanced inductor L4a.

The filter device 100C includes a capacitor Cg (first capacitor) connected between a first connection point T1a of the first balanced inductor L1a and the second balanced inductor L2a and a second connection point T2a of the third balanced inductor L3a and the fourth balanced inductor L4a. Further, the filter device 100C includes a capacitor C1a (second capacitor) and a capacitor C2a (second capacitor), in which the capacitor C1a is connected between a third connection point T3a of the first balanced terminal P1a and the first balanced inductor L1a and a fourth connection point T4a of the third balanced terminal P3a and the third balanced inductor L3a, and the capacitor C2a is connected between a fifth connection point T5a of the second balanced terminal P2a and the second balanced inductor L2a and a sixth connection point Toa of the fourth balanced terminal P4a and the fourth balanced inductor L4a. The capacitors C1a and C2a are shunt capacitors. In the filter device 100C, a shunt capacitor is provided in both the capacitor C1a and the capacitor C2a, but the shunt capacitor may be provided in one of the capacitors C1a and C2a.

The filter device 100C may include a capacitor C12a (third capacitor) connected in parallel to the first balanced inductor L1a and the second balanced inductor L2a between the first balanced terminal P1a and the second balanced terminal P2a, and a capacitor C34a (third capacitor) connected in parallel to the third balanced inductor L3a and the fourth balanced inductor L4a between the third balanced terminal P3a and the fourth balanced terminal P4a. The first balanced inductor L1a and the second balanced inductor L2a are mutually additively connected, and the third balanced inductor L3a and the fourth balanced inductor L4a are mutually additively connected. Due to the additive connection, a negative inductor (−M) is left in the circuit configuration. In the filter device 100C, the first balanced inductor L1a and the second balanced inductor L2a are additively connected to each other, the third balanced inductor L3a and the fourth balanced inductor L4a are additively connected to each other. However, additive connection may also be made either between the first balanced inductor L1a and the second balanced inductor L2a, or between the third balanced inductor L3a and the fourth balanced inductor L4a.

The filter device 100C according to Example Embodiment 4 can obtain the same transmission characteristics as those of the filter device 100 shown in FIG. 3 by adjusting the values of the parameters of the respective elements.

Example Embodiment 5

In the filter device 100 according to Example Embodiment 1, the first inductor L1, the second inductor L2, and the capacitors C1, C2, Cg and C12 are provided in the insulator 3 with the structure shown in FIGS. 4 and 5. In particular, the capacitor Cg (first capacitor) has a structure in which the wiring pattern 13 connecting the first inductor L1 and the second inductor L2 is one electrode thereof, and the wiring pattern 11 connecting the ground terminals G1 and G2 is the other electrode thereof. However, in the filter device, the structure of the first inductor L1, the second inductor L2, and the capacitor Cg is not limited to the structure shown in FIGS. 4 and 5, but may be a structure in which the first inductor L1 and the second inductor L2 and the capacitor Cg are arranged in different regions within the insulator 3.

Figure 13:
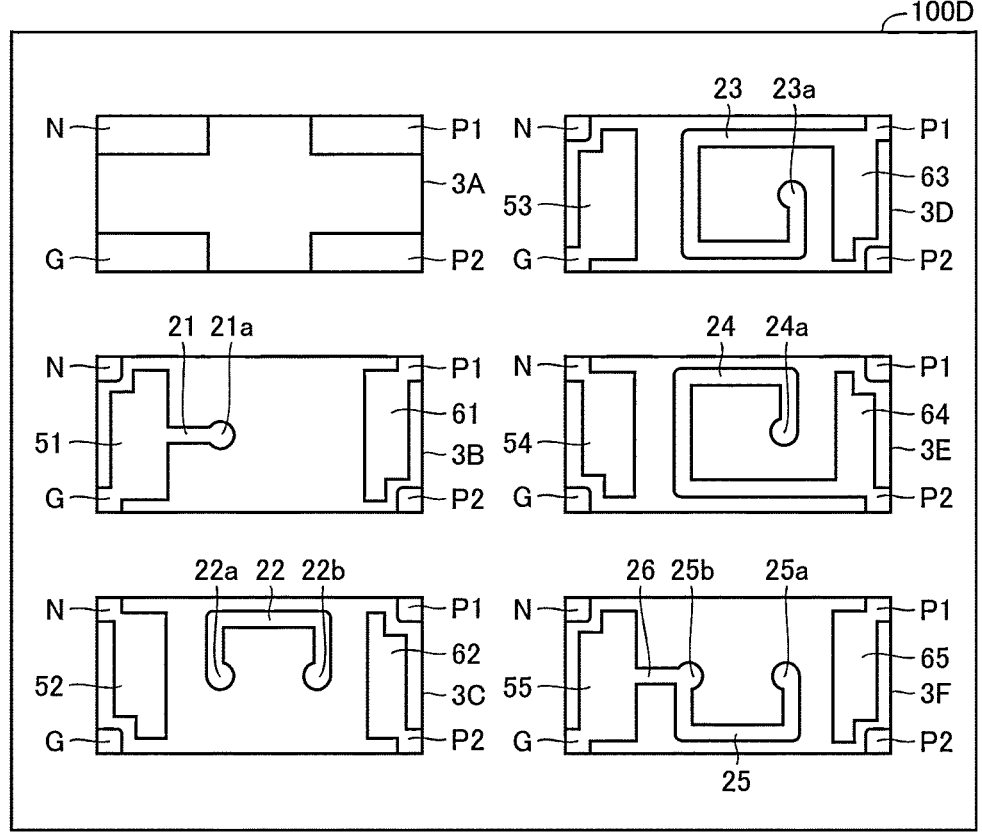
FIG. 13 is an exploded plan view showing a configuration of a filter device according to Example Embodiment 5 of the present invention.

FIG. 13 is an exploded plan view showing a configuration of a filter device 100D according to Example Embodiment 5. In the filter device 100D, the electrode of a first terminal P1, the electrode of a second terminal P2, a ground terminal G, the electrode of a non-connect terminal N, and wiring patterns 21 to 25 are each provided on insulating layers 3A to 3F by the photolithography method. On the insulating layer 3A shown in FIG. 13, the electrodes are provided at the four corners. Specifically, an electrode of the first terminal P1 and an electrode of the second terminal P2 are arranged along one short side of the insulating layer 3A, and an electrode of the ground terminal G and an electrode of the non-connect terminal N extend along the other short side of the insulating layer 3A.

The electrodes of the first terminal P1 provided on each layer are electrically connected by electrodes provided on the side surface of the long side and the side surface of the short side. The electrodes of the second terminal P2, the ground terminals G, and the electrodes of the non-connect terminal N provided on each layer are also electrically connected respectively by electrodes provided on the side surface of the long side and the side surface of the short side. Instead of being electrically connected by the electrodes provided on the side surface of the long side and the side surface of the short side, each layer may be connected through via conductors to thereby electrically connect the electrodes of the first terminal P1, the electrodes of the second terminal P2, the electrodes of the ground terminal G and the electrodes of the non-connect terminal N, respectively, provided on each layer.

A wiring pattern 51, a wiring pattern 21, and a wiring pattern 61 are provided on the insulating layer 3B. The wiring pattern 51 is electrically connected to the electrode of the ground terminal G and defines an electrode of the capacitor Cg (first capacitor) arranged on the left side of the insulating layer in the drawing. The wiring pattern 21 is a wiring to electrically connect the wiring pattern 51 and the first inductor L1 arranged at the center of the insulating layer in the drawing, and is extending from the wiring pattern 51 to a connection portion 21*a*. The wiring pattern 61 is electrically connected to the electrode of the first terminal P1, and defines an electrode on the first terminal P1 side of the capacitor C12 (third capacitor) arranged on the right side of the insulating layer in the drawing.

A wiring pattern 52, a wiring pattern 22, and a wiring pattern 62 are provided on the insulating layer 3C. The wiring pattern 52 is electrically connected to the electrode of the non-connect terminal N and defines an electrode of the capacitor Cg. The wiring pattern 22 defines a portion of the first inductor L1, and is extending from a connection portion 22*a* to a connection portion 22*b* to form a U-shaped pattern. The connection portion 22*a* is electrically connected to the connection portion 21*a* of the insulating layer 3B through a via conductor. When the filter device 100D is mounted on the substrate, a portion of the wiring pattern 22 also functions as an electrode that defines a capacitor C1 (second capacitor) with the ground wiring of the substrate. The wiring pattern 62 is electrically connected to the electrode of the second terminal P2 and defines an electrode on the second terminal P2 side of a capacitor C12.

A wiring pattern 53, a wiring pattern 23, and a wiring pattern 63 are provided on the insulating layer 3D. The wiring pattern 53 is electrically connected to the electrode of the ground terminal G and defines an electrode of the capacitor Cg. The wiring pattern 23 defines a portion of the first inductor L1 and is extending from a connection portion 23*a* to the wiring pattern 63 to form a rectangular pattern. The connection portion 23*a* is electrically connected to the connection portion 22*b* of the insulating layer 3C through a via conductor. The wiring pattern 63 is electrically connected to the electrode of the first terminal P1, and defines an electrode on the first terminal P1 side of the capacitor C12.

A wiring pattern 54, a wiring pattern 24, and a wiring pattern 64 are provided on the insulating layer 3E. The wiring pattern 54 is electrically connected to the electrode of the non-connect terminal N and defines an electrode of the capacitor Cg. The wiring pattern 24 defines a portion of the second inductor L2, and is extending from a connection portion 24*a* to the wiring pattern 64 to define a rectangular or substantially rectangular pattern. The connection portion 24*a* is electrically connected to the connection portion 23*a* of the insulating layer 3D through a via conductor. The wiring pattern 64 is electrically connected to the electrode of the second terminal P2, and defines an electrode on the second terminal P2 side of the capacitor C12.

A wiring pattern 55, a wiring pattern 25, a wiring pattern 26, and a wiring pattern 65 are provided on the insulating layer 3F. The wiring pattern 55 is electrically connected to the electrode of the ground terminal G and defines an electrode of the capacitor Cg. The wiring pattern 25 defines a portion of the second inductor L2, and is extending from a connection portion 25*a* to a connection portion 25*b* to define a U-shaped pattern. The connection portion 25*a* is electrically connected to the connection portion 24*a* of the insulating layer 3E through a via conductor. The wiring pattern 26 is a wiring to electrically connect the wiring pattern 55 and the second inductor L2, and is extending from the wiring pattern 55 to the connection portion 25*b*. The wiring pattern 65 is electrically connected to the electrode of the first terminal P1, and defines an electrode on the first terminal P1 side of the capacitor C12.

The plurality of insulating layers 3A to 3F of the filter device 100D shown in FIG. 13 are stacked and subjected to a process such as firing and solidification. The electrode of the first terminal P1, the electrode of the second terminal P2, the ground terminal G, and the electrode of the non-connect terminal N are provided on the side surfaces of the insulator 3 which has been subjected to the process such as firing and solidification.

In the filter device 100D, since the first inductor L1 and second inductor L2 and the capacitor Cg are arranged in different regions within the insulator 3, the wiring patterns 21 and 26 to electrically connect the first inductor L1 and second inductor 12 and the capacitor Cg are provided. The first inductor L1 and the second inductor L2 function as a transformer by magnetic coupling. When the first inductor L1 and the second inductor L2 are simply connected to define and function as a transformer, the coupling coefficient k is about 0.53, for example. The coupling coefficient k is calculated by performing a simulation for a configuration in which the outer diameter of the coil is about 270 μm, the width of the wiring pattern is about 30 μm, and the first inductor L1 and the second inductor L2 are each of 1.5 turns, for example.

On the other hand, in the filter device 100D, since the first inductor L1 and the second inductor L2 are connected via the capacitor Cg, the coupling coefficient k decreases due to parasitic inductances of the wiring patterns 51 to 55, the electrode of the ground terminal G, the electrode of the non-connect terminal N and the like. Specifically, when the same simulation is performed for the filter device 100D, the coupling coefficient k becomes about 0.32, for example, which is about 0.2 lower than a configuration in which the first inductor L1 and the second inductor L2 are simply connected.

Figure 14:
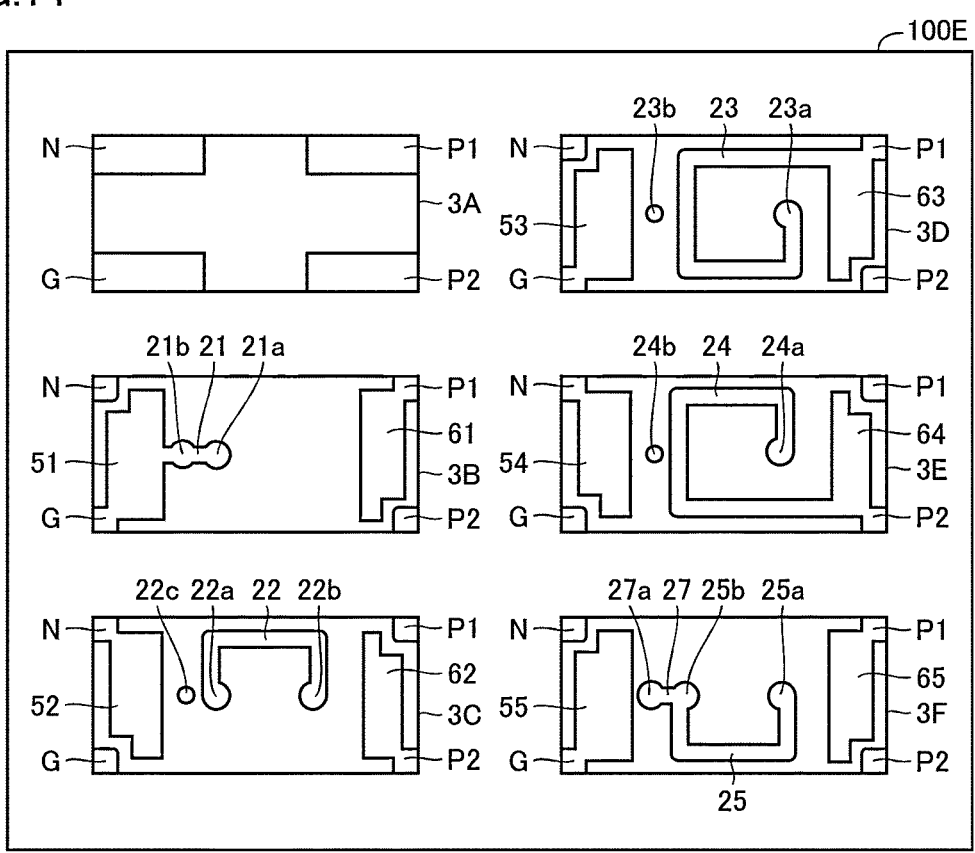
FIG. 14 is an exploded plan view showing another configuration of the filter device according to Example Embodiment 5 of the present invention.

Therefore, a filter device with a structure in which the first inductor L1 and the second inductor L2 are connected without the capacitor Cg will be described. FIG. 14 is an exploded plan view showing another configuration of the filter device according to Example Embodiment 5. In a filter device 100E shown in FIG. 14, the electrode of a first terminal P1, the electrode of a second terminal P2, a ground terminal G, the electrode of a non-connect terminal N, and wiring patterns 21 to 25 are each provided on insulating layers 3A to 3F by the photolithography method. On the insulating layer 3A shown in FIG. 14, the electrodes are provided at four corners. In the filter device 100E shown in FIG. 14, the same components as those of the filter device 100D shown in FIG. 13 are denoted by the same reference signs, and the detailed description thereof will not be repeated.

A wiring pattern 51, a wiring pattern 21, and a wiring pattern 61 are provided on the insulating layer 3B. The wiring pattern 21 includes a connection portion 21*b* between the wiring pattern 51 and a connection portion 21*a*.

A wiring pattern 52, a wiring pattern 22, and a wiring pattern 62 are provided on the insulating layer 3C. Further, a connection portion 22*c* is between the connection portion 22*a* and the wiring pattern 52. The connection portion 22*a* is electrically connected to the connection portion 21*a* of the insulating layer 3B through a via conductor, and the connection portion 22*c* is electrically connected to the connection portion 21*b* of the insulating layer 3B through a via conductor.

A wiring pattern 53, a wiring pattern 23, and a wiring pattern 63 are provided on the insulating layer 3D. Further, a connection portion 23b is between the wiring pattern 53 and the wiring pattern 23. A connection portion 23a is electrically connected to the connection portion 22b of the insulating layer 3C through a via conductor, and the connection portion 23b is electrically connected to the connection portion 22c of the insulating layer 3C through a via conductor.

A wiring pattern 54, a wiring pattern 24, and a wiring pattern 64 are provided on the insulating layer 3E. Further, a connection portion 24b is between the wiring pattern 54 and the wiring pattern 24. A connection portion 24a is electrically connected to the connection portion 23a of the insulating layer 3D through a via conductor, and the connection portion 24b is electrically connected to the connection portion 23b of the insulating layer 3D through a via conductor.

A wiring pattern 55, a wiring pattern 25, a wiring pattern 27, and a wiring pattern 65 are provided on the insulating layer 3F. Further, a connection portion 27a is between the wiring pattern 55 and the wiring pattern 25. The wiring pattern 27 is a wiring to electrically connect the connection portion 27a and a connection portion 25b. A connection portion 25a is electrically connected to the connection portion 24a of the insulating layer 3E through a via conductor, and the connection portion 27a is electrically connected to the connection portion 24b of the insulating layer 3E through a via conductor.

The plurality of insulating layers 3A to 3F of the filter device 100E shown in FIG. 14 are stacked and subjected to a process such as firing and solidification. The electrode of the first terminal P1, the electrode of the second terminal P2, the ground terminal G, and the electrode of the non-connect terminal N are provided on the side surfaces of the insulator 3 which has been subjected to the process such as firing and solidification.

In the filter device 100E, since the first inductor L1 and second inductor L2 and the capacitor Cg are located in different regions within the insulator 3, the wiring pattern 21 to electrically connect the first inductor L1 and second inductor L2 and the capacitor Cg is provided. However, in the filter device 100E, the wiring pattern 25 of the second inductor L2 is not directly connected to the capacitor Cg, but is connected to the wiring pattern 21 through a via conductor. Therefore, in the filter device 100E, the first inductor L1 and the second inductor L2 are not connected via the capacitor Cg, but the second inductor L2 is connected to the first inductor L1 by the wiring pattern 21 and then connected to the capacitor Cg. Thus, in the filter device 100E, since parasitic inductances of the wiring patterns 51 to 55, the electrodes of the ground terminal G, and the electrodes of the non-connect terminal N are not generated, the decrease in the coupling coefficient k can be reduced or prevented. Specifically, when the same simulation is performed for the filter device 100E, the coupling coefficient k becomes about 0.41, which can be reduced by about 0.1 compared to a configuration in which the first inductor L1 and the second inductor L2 are simply connected, for example. In other words, in the filter device 100E, the coupling coefficient k can be improved by about 10% compared to the filter device 100D.

In the filter devices 100D and 100E, as shown in FIGS. 13 and 14, the first terminal P1 and the second terminal P2 are arranged along one short side of the insulator 3, and the ground terminal G1 and the non-connect terminal N are arranged along the other short side of the insulator 3.

However, the arrangement of the terminals is not limited to the above-described manner; and in the filter devices 100D and 100E, the first terminal P1 and the second terminal P2 may be arranged along one long side of the insulator 3, and the ground terminal G1 and the non-connect terminal N may be arranged along the other long side of the insulator 3. In the filter devices 100D and 100E, the non-connect terminal N may be a ground terminal G.

Figures 15, 16:
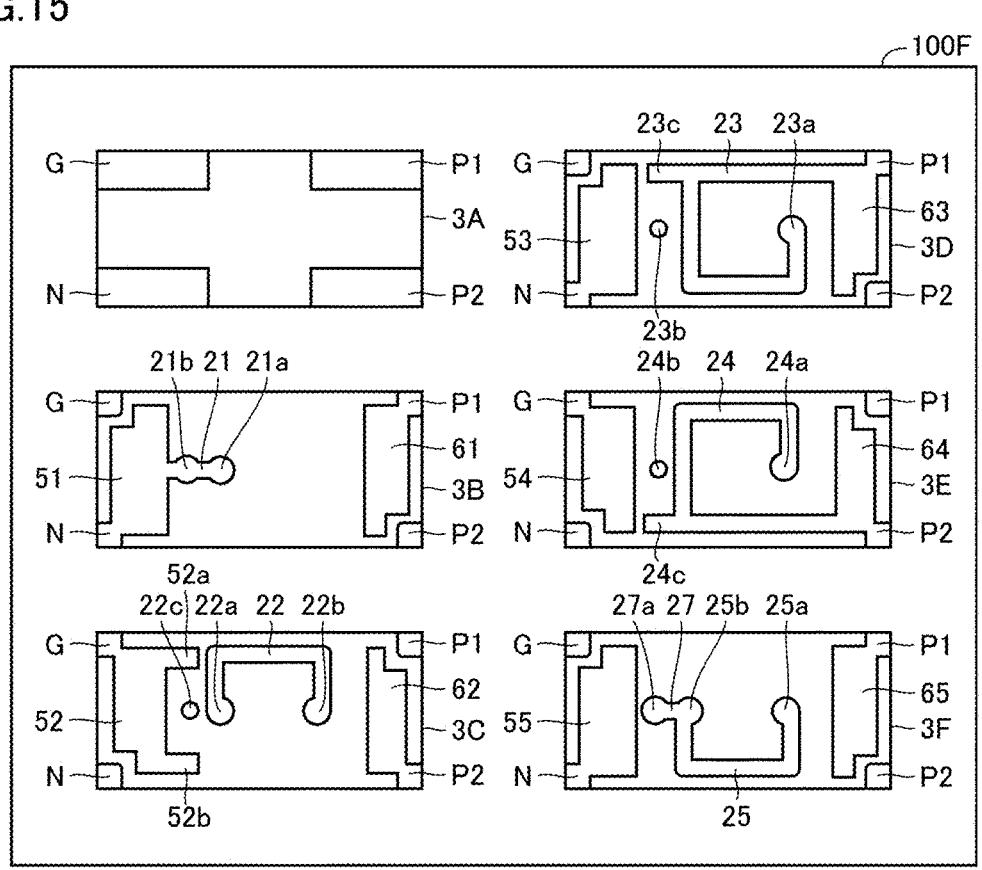
FIG. 15 is an exploded plan view showing further another configuration of the filter device according to Example Embodiment 5 of the present invention.
FIG. 16 is a schematic view showing a communication device.

It has been described that, in the filter devices 100D and 100E, when the filter devices 100D and 100E are mounted on the substrate, a portion of the wiring pattern 22 also functions as an electrode that defines a capacitor C1 (second capacitor) with the ground wiring of the substrate. However, instead of being limited to the above-described configuration, a capacitor C1 and a capacitor C2 may be provided in the structure shown in the filter devices 100D and 100E. FIG. 15 is an exploded plan view showing further another configuration of the filter device according to Example Embodiment 5. In a filter device 100F shown in FIG. 15, the electrode of a first terminal P1, the electrode of a second terminal P2, a ground terminal G, the electrode of a non-connect terminal N, and wiring patterns 21 to 25 are each provided on insulating layers 3A to 3F by the photolithography method. In the filter device 100F shown in FIG. 15, the same components as those of the filter device 100D shown in FIG. 13 and the filter device 100E shown in FIG. 14 are denoted by the same reference signs, and the detailed description thereof will not be repeated.

A wiring pattern 52, a wiring pattern 22, and a wiring pattern 62 are provided on the insulating layer 3C. The wiring pattern 52 is electrically connected to the electrode of the ground terminal G and defines an electrode of the capacitor Cg (first capacitor) arranged on the left side of the insulating layer in the drawing. Further, a wiring pattern 52a, which functions as one electrode of the capacitor C1 (second capacitor), and a wiring pattern 52b, which functions as one electrode of the capacitor C2 (second capacitor), are connected to the wiring pattern 52.

A wiring pattern 53, a wiring pattern 23, and a wiring pattern 63 are provided on the insulating layer 3D. The wiring pattern 23 defines a portion of the first inductor L1 and is extending from a connection portion 23a to the wiring pattern 63 to form a rectangular or substantially rectangular pattern. Further, a wiring pattern 23c, which functions as the other electrode of the capacitor C1, is connected to the wiring pattern 23.

A wiring pattern 54, a wiring pattern 24, and a wiring pattern 64 are provided on the insulating layer 3E. The wiring pattern 24 defines a portion of the second inductor L2, and is extending from a connection portion 24a to the wiring pattern 64 to form a rectangular pattern. Further, a wiring pattern 24c, which functions as the other electrode of the capacitor C2, is connected to the wiring pattern 24.

The plurality of insulating layers 3A to 3F of the filter device 100F shown in FIG. 15 are stacked and subjected to a process such as firing and solidification. The electrode of the first terminal P1, the electrode of the second terminal P2, the ground terminal G, and the electrode of the non-connect terminal N are provided on the side surfaces of the insulator 3 which has been subjected to the process such as firing and solidification.

The filter device 100E has electrodes (the wiring pattern 23c, the wiring pattern 52a, the wiring pattern 24c, and the wiring pattern 52b) corresponding to the capacitors C1 and C2 (second capacitors) shown in the circuit diagram shown in FIG. 1. Therefore, both the capacitor C1 and the capacitor C2 are provided as shunt capacitors in the filter device 100E.

Either capacitor C1 or capacitor C2 may be provided as a shunt capacitor in the filter device 100E.

Common effects of the filter devices 100D and 100E will be described below. As shown in FIG. 13, the wiring pattern 23 provided on the insulating layer 3D is connected to the wiring pattern 63 of the electrode of the capacitor C12. Further, as shown in FIG. 13, the wiring pattern 24 provided on the insulating layer 3E is connected to the wiring pattern 64 of an electrode of the capacitor C12. Further, since the wiring pattern 23 and the wiring pattern 24 overlap each other when viewed from the top surface, they can be regarded as a portion of the electrodes of the capacitor C12. Therefore, the area of the wiring pattern 63 and the wiring pattern 64 can be reduced by reducing the capacitance formed by the wiring pattern 63 and the wiring pattern 64 by the capacitance formed by the wiring pattern 23 and the wiring pattern 24. In other words, in the filter device 100D, the wiring pattern 63 and the wiring pattern 64 of the capacitor C12 can be reduced. Such an effect is the same for the filter devices 100E and 100F.

Further, the distance from the wiring pattern 64 of the electrode of the capacitor C12 in the insulating layer 3E to the electrode of the first terminal P1 in the insulating layer 3A and the distance from the wiring pattern 63 of the electrode of the capacitor C12 in the insulating layer 3D to the electrode of the second terminal P2 in the insulating layer 3A are substantially the same. Therefore, in the filter device 100D, the parasitic inductance generated from the first terminal P1 to the second connection point T2 and the parasitic inductance generated from the second terminal P2 to the third connection point T3 in the circuit diagram shown in FIG. 1 are substantially the same, which facilitates the design of the transformer. Such an effect is the same for the filter devices 100E and 100F.

Variations

The filter devices 100 and 100A to 100C described above are mounted on a high-frequency module or directly provided to a communication device. FIG. 16 is a schematic diagram showing the communication device. A communication device 300 shown in FIG. 16 can communicate in a band including several 100 MHz and several GHz, for example. Therefore, the communication device 300 is provided with a high-frequency module 150 to process signals transmitted and received by an antenna, and the high-frequency module 150 is mounted on a substrate 310. The communication device 300 is, for example, a cellular phone, a smartphone or a tablet.

The high-frequency module 150 includes electronic components such as the filter device 100, a switch 110 and an amplifier 120. The communication device 300 includes a power supply circuit 320 and the like in addition to the substrate 310 on which the high-frequency module 150 is mounted.

The filter devices 100 and 100A to 100C described above have been described as an LPF (low-pass filter), but can also be applied to a BSF (band-stop filter), for example.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a first terminal;
a first inductor connected to the first terminal;
a second inductor connected in series to the first inductor;

a second terminal connected to the second inductor;
a first capacitor connected between a first connection point of the first inductor and the second inductor and a ground; and
a second capacitor connected either between a second connection point of the first terminal and the first inductor and the ground, or between a third connection point of the second terminal and the second inductor and the ground; wherein
the first inductor and the second inductor are mutually additively connected to each other; and
the first capacitor is connected between the first connection point and the ground without an inductor connected between the first capacitor and the first connection point and without an inductor connected between the first capacitor and the ground.

2. The filter device according to claim 1, wherein a direction of a magnetic field generated by the first inductor and a direction of a magnetic field generated by the second inductor are the same.

3. The filter device according to claim 1, further comprising:
a third capacitor connected in parallel to the first inductor and the second inductor between the first terminal and the second terminal.

4. The filter device according to claim 1, further comprising:
a third inductor connected in series between the second capacitor and the ground.

5. The filter device according to claim 1, wherein
the first inductor, the second inductor, the first capacitor, and the second capacitor are located in an insulator including a pair of main surfaces facing each other and side surfaces connecting the main surfaces; and
the insulator includes a plurality of first wiring patterns therein defining a portion of the first inductor, and a plurality of second wiring patterns at least partially overlapping, when viewed in a plan view from the side of one of the main surfaces, with the first wiring patterns and that define a portion of the second inductor.

6. The filter device according to claim 5, wherein the first wiring patterns and the second wiring patterns are stacked in the insulator in a direction extending between the main surfaces.

7. The filter device according to claim 6, wherein the first wiring patterns and the second wiring patterns are stacked alternately in the insulator.

8. The filter device according to claim 5, wherein the insulator includes a first electrode connected to the first terminal, a second electrode connected to the second terminal, and a ground electrode.

9. A high-frequency module comprising:
the filter device according to claim 1; and
an electronic component connected to the filter device.

10. A communication device comprising the high-frequency module according to claim 9.

11. The communication device according to claim 10, wherein the communication device is a cellular phone, a smartphone or a tablet.

12. The filter device according to claim 1, wherein a plurality of units, each including the first inductor, the second inductor, and the first capacitor, are connected.

13. The filter device according to claim 1, wherein the filter device is a low pass filter or a band stop filter.

14. A filter device comprising:

a first terminal;

a first inductor connected to the first terminal;

a second inductor connected in series to the first inductor;

a second terminal connected to the second inductor;

a first capacitor connected between a first connection point of the first inductor and the second inductor and a ground; and a second capacitor connected either between a second connection point of the first terminal and the first inductor and the ground, or between a third connection point of the second terminal and the second inductor and the ground; wherein the first inductor and the second inductor are mutually additively connected to each other;

the first inductor, the second inductor, the first capacitor, and the second capacitor are located in an insulator including a pair of main surfaces facing each other and side surfaces connecting the main surfaces;

the insulator includes a plurality of first wiring patterns therein defining a portion of the first inductor, and a plurality of second wiring patterns at least partially overlapping, when viewed in a plan view from the side of one of the main surfaces, with the first wiring patterns and that define a portion of the second inductor;

each of the plurality of first wiring patterns and the plurality of second wiring patterns has a loop shape of less than one turn when viewed from a side of one of the main surfaces; and in the insulator, the plurality of first wiring patterns and the plurality of second wiring patterns are combined to define a coil pattern including one or more turns.

15. A filter device comprising:

a first terminal;

a first inductor connected to the first terminal;

a second inductor connected in series to the first inductor;

a second terminal connected to the second inductor;

a first capacitor connected between a first connection point of the first inductor and the second inductor and a ground;

a second capacitor connected either between a second connection point of the first terminal and the first inductor and the ground, or between a third connection point of the second terminal and the second inductor and the ground; and a third capacitor connected in parallel to the first inductor and the second inductor between the first terminal and the second terminal; wherein the first inductor and the second inductor are mutually additively connected to each other;

the first inductor, the second inductor, the first capacitor, the second capacitor, and the third capacitor are in an insulator including a pair of mutually opposed main surfaces and side surfaces connecting the main surfaces;

the insulator comprises:

a plurality of first wiring patterns within the insulator and defining a portion of the first inductor;

a plurality of second wiring patterns at least partially overlapping, when viewed in a plan view from the side of one of the main surfaces, with the first wiring patterns and defining a portion of the second inductor;

a plurality of third wiring patterns that connect the first wiring patterns and the second wiring patterns; and a first electrode connected to the first terminal, a second electrode connected to the second terminal, and a ground electrode;

the first capacitor includes a third electrode and a fourth electrode, the third electrode being a portion of the first wiring pattern and the second wiring pattern and is a portion outside of a portion of a wiring pattern defining a coil pattern and the fourth electrode is a wiring pattern connected with the ground electrode, and positioned such that the third electrode and the fourth electrode overlap when viewed from the side of one of the main surfaces;

the second capacitor includes a fifth electrode and a sixth electrode, the fifth electrode defining the third wiring pattern and the sixth electrode is a wiring pattern connecting the ground electrodes, and positioned such that the fifth electrode and the sixth electrode overlap when viewed from the side of one of the main surfaces; and the third capacitor includes a seventh electrode and an eighth electrode, the seventh electrode defining a portion of the first wiring pattern with a larger wiring width than other portions and the eighth electrode is a portion of the second wiring pattern with a larger wiring width than other portions, and positioned such that the seventh electrode and the eighth electrode overlap when viewed from the side of one of the main surfaces.

16. The filter device according to claim 15, wherein the first capacitor is on one side of the insulator when viewed from the side of one of the main surfaces, and the second capacitor is on one side of the insulator different from the side on which is the first capacitor is located.

17. The filter device according to claim 15, wherein the plurality of first wiring patterns, the plurality of second wiring patterns, and the plurality of third wiring patterns are respectively connected in parallel through via conductors.

18. The filter device according to claim 15, wherein the insulator has a rectangular or substantially rectangular shape when viewed from the side of one of the main surfaces;

the ground electrode includes a first ground electrode and a second ground electrode along a long side of the insulator.

19. A filter device comprising:

a first balanced terminal;

a first balanced inductor connected to the first balanced terminal;

a second balanced inductor connected in series to the first balanced inductor;

a second balanced terminal connected to the second balanced inductor;

a third balanced terminal;

a third balanced inductor connected to the third balanced terminal;

a fourth balanced inductor connected in series to the third balanced inductor;

a fourth balanced terminal connected to the fourth balanced inductor;

a first capacitor connected between a first connection point of the first balanced inductor and the second balanced inductor and a second connection point of the third balanced inductor and the fourth balanced inductor; and a second capacitor connected at least either between a third connection point of the first balanced terminal and the first balanced inductor and a fourth connection point of the third balanced terminal and the third balanced inductor, or between a fifth connection point of the second balanced terminal and the second balanced inductor and a sixth connection point of the fourth balanced terminal and the fourth balanced inductor; wherein a mutually additive connection is provided at least either between the first balanced inductor and the second balanced inductor or between the third balanced inductor and the fourth balanced inductor; and the first capacitor is connected between the first connection point and the second connection point without an inductor connected between the first capacitor and the first connection point and without an inductor connected between the first capacitor and the second connection point.

20. The filter device according to claim 19, wherein the filter device is a low pass filter or a band stop filter.

* * * * *